US006067266A

United States Patent [19]

Donelan

[11] Patent Number: 6,067,266

[45] Date of Patent: May 23, 2000

[54] ERASABLE BOARD KIT

[76] Inventor: James P. Donelan, 4720 Wallbank Ave., Downers Grove, Ill. 60515

[21] Appl. No.: 09/190,701

[22] Filed: Nov. 12, 1998

[51] Int. Cl.[7] .................... G11C 7/00; G09F 15/00

[52] U.S. Cl. .................... 365/218; 428/14

[58] Field of Search .................... 365/218; 428/14, 428/455, 904.4; 156/230

[56] References Cited

U.S. PATENT DOCUMENTS

| | | |
|---|---|---|
| 1,757,287 | 5/1930 | Bildstein . |
| 2,879,608 | 3/1959 | Watkins . |
| 3,149,426 | 9/1964 | Kaeyer . |
| 3,405,460 | 10/1968 | Michaelson . |
| 3,512,273 | 5/1970 | Baker, Jr. et al. . |
| 3,579,871 | 5/1971 | Eddington . |
| 5,324,202 | 6/1994 | Meyers et al. . |
| 5,527,568 | 6/1996 | Boone et al. .................... 428/14 |
| 5,599,189 | 2/1997 | Kees . |
| 5,900,094 | 5/1999 | Santini et al. .................... 156/230 |

*Primary Examiner*—David Nelms
*Assistant Examiner*—Thong Le
*Attorney, Agent, or Firm*—Hill & Simpson

[57] ABSTRACT

An erase board or erasable board is provided with a substrate layer disposed underneath a clear film layer. The clear film layer is written on with dry erase markers. Graphics may be disposed directly on the substrate or a middle sheet may be provided for placement between the clear layer and the substrate. The middle sheet may accommodate graphics, design or other indicia which may be printed on the middle sheet by hand or by computer. The middle sheet may be easily and conveniently replaced and substituted with another middle sheet having an alternative design printed thereon.

20 Claims, 1 Drawing Sheet

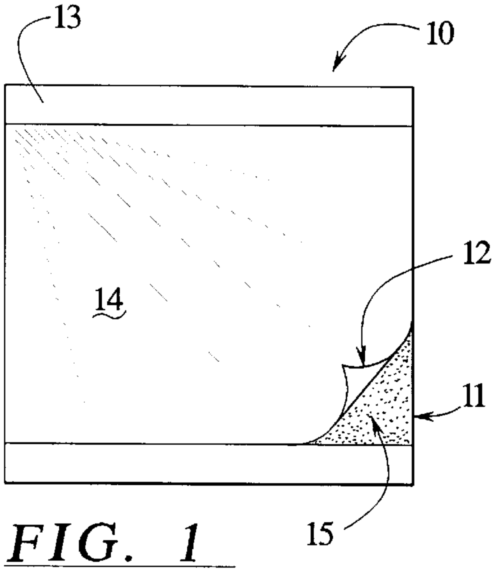
FIG. 1
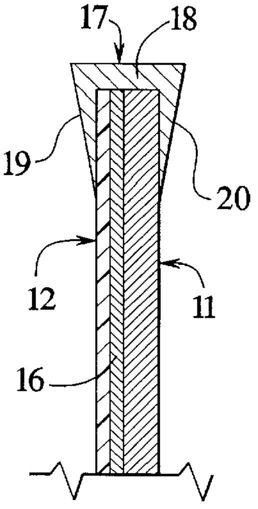
FIG. 4
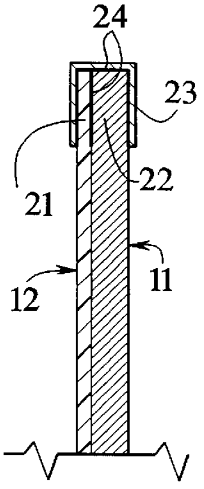
FIG. 5
FIG. 2
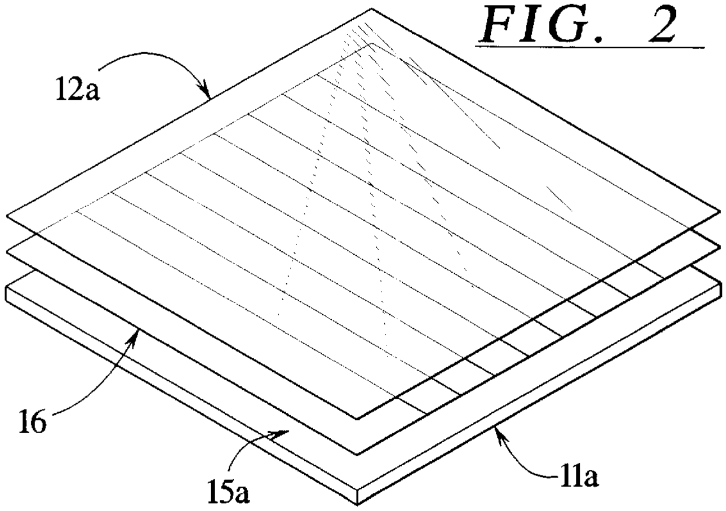
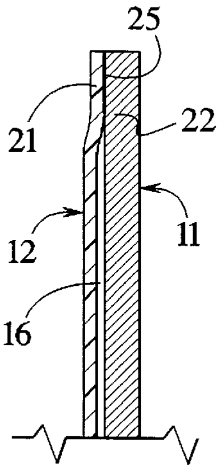
FIG. 6
FIG. 3
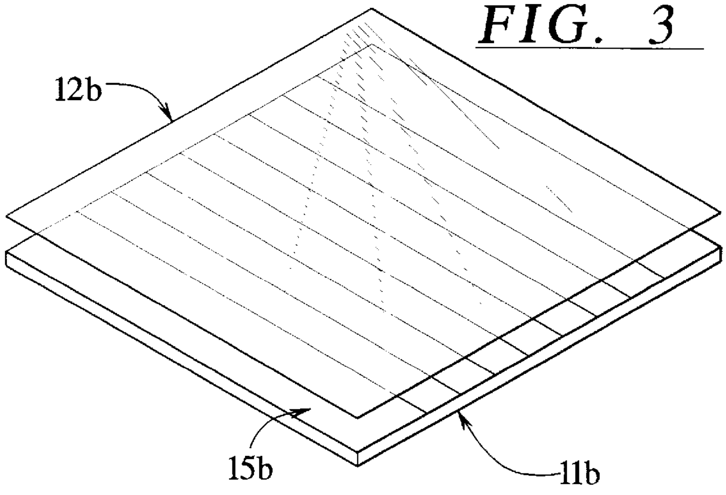
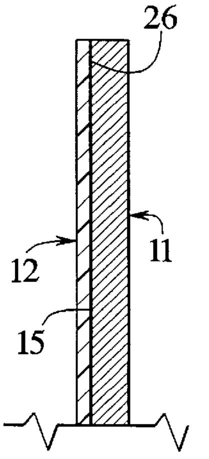
FIG. 7

ERASABLE BOARD KIT

BACKGROUND OF THE INVENTION

The present invention relates generally to erasable boards including so-called "dry erase" boards. More specifically, the present invention relates to erasable board kits with a substrate that includes a design or indicia disposed thereon.

Dry erase boards are known. A typical dry erase board includes a white board or substrate that is coated with an enamel, film, ultraviolet cured liquid, liquid varnish, or porcelain finish. Specially designed markers are employed which are used to write on the substrate. While the ink of the marker dries on the substrate, the ink does not bond to the substrate surface and the writing can be easily removed with a soft eraser, cloth, finger, etc.

One shortcoming of such dry erase boards is the inability to easily either apply graphics or indicia to the substrate or the inability to easily change any graphics or indicia that has been previously applied to the substrate. For example, some dry erase boards are provided with horizontal lines for writing purposes. The lines are not removable and cannot be altered. Other boards may have an indicia or a design permanently adhered to the board with paint or permanent marking pens. Again, once the indicia is implied, it is difficult or time consuming to remove.

Therefore, there is a need for an improved dry erase board which provides a substrate equipped with a design, graphics or indicia and further which enables the design, graphics or indicia to be easily changed or exchanged during the life of the board.

SUMMARY OF THE INVENTION

The present invention satisfies the aforenoted needs by providing an erase board that comprises a substrate comprising a front surface and at least one edge. The substrate is disposed underneath a clear film layer or sheet which serves as the writing surface. The clear film layer comprises at least one edge. The edge of the film layer is coupled or attached to the edge of the substrate. The dry erase board further comprises indicia disposed between the substrate and the clear film layer. The indicia can be seen through the clear film.

In an embodiment, the indicia is disposed on a middle sheet that is sandwiched between the clear film layer and the substrate.

In an embodiment, the indicia is printed onto the middle sheet.

In an embodiment, the middle sheet is removable and replaceable with an alternative middle sheet with alternative indicia printed thereon.

In an embodiment, the indicia printed on the middle sheet is generated by a computer.

In an embodiment, the indicia is disposed on the front surface of the substrate.

In an embodiment, the indicia is painted onto the front surface of the substrate.

In an embodiment, the front surface of the substrate is coated with the indicia.

In an embodiment, the edge of the clear film layer is attached to the edge of the substrate by glue, lamination, heat bonding or the edge of the clear film layer is attached to the edge of the substrate with an elongated clip or fastener.

In an embodiment, the present invention provides a method for manufacturing a dry erase board that comprises the steps of providing a substrate comprising a front surface and at least one edge, providing a middle sheet, providing a clear film layer with at least one edge, generating a design for printing on the middle sheet, printing the design on the middle sheet, placing the middle sheet on the substrate with the design facing upwards, and, attaching the edge of the clear film layer to the edge of the substrate with a middle sheet disposed between the clear film layer and the substrate.

In an embodiment, the generating of the design for the middle sheet is performed on a computer.

In an embodiment, the method further comprises the steps of generating a plurality of designs for printing on a plurality of alternative middle sheets, and, printing the plurality of alternative designs on the plurality of alternative middle sheets.

In an embodiment, the middle sheet is removable from its position between the substrate and the clear film layer and replaceable with an alternative middle sheet having an alternative design printed thereon.

In an embodiment, the present invention provides a kit for a dry erase board. The kit comprises a substrate comprising a front surface and at least one edge. The substrate is disposed underneath a clear film layer comprising at least one edge. The edge of the clear film layer is attached to the edge of the substrate. The kit further comprises a plurality of middle sheets for placement between the clear film layer and the substrate. Each middle sheet is printed with at least one of a plurality of alternative designs.

In an embodiment, the kit further comprises a software program for creating the alternative designs on a computer and printing the alternative designs on the middle sheets with a computer printer.

In an embodiment, the edge of the clear film layer is glued to the edge of the substrate.

In an embodiment, the edge of the clear film layer is attached to the edge of the substrate with an elongated clip or fastener.

It is therefore an advantage of the present invention to provide a dry erase board which provides a design, graphics or indicia underneath the writing surface which can be easily changed, modified or exchanged.

Another advantage of the present invention is that it provides an improved kit for creating a dry erase board.

Yet another advantage of the present invention is that it provides a method for manufacturing a dry erase board with a design, graphics or indicia disposed underneath the writing layer which can be easily changed, modified or exchanged.

Other objects and advantages of the invention will become apparent upon reading the following detailed description and appended claims, and upon reference to the accompanying drawings.

BRIEF DESCRIPTION OF THE DRAWINGS

For a more complete understanding of the present invention, reference should now be made to the embodiments illustrated in greater detail in the accompanying drawings and described below by way of examples of the invention.

In the drawings:

FIG. 1 is a plan view of a dry erase board made in accordance with the present invention;

FIG. 2 is a perspective view illustrating the three layers of a dry erase board made in accordance with the present invention;

FIG. 3 is a perspective view illustrating the two layers of a dry erase board made in accordance with the present invention;

FIG. 4 is a partial sectional view of a dry erase board made in accordance with the present invention illustrating a means for connecting the substrate, middle layer and clear film layer together;

FIG. 5 is a partial sectional view of a dry erase board made in accordance with the present invention and illustrating an alternative means for connecting the clear film layer to the substrate;

FIG. 6 is a partial sectional view of a dry erase board made in accordance with the present invention and illustrating a means for connecting the clear film layer to the substrate; and FIG. 7 is a partial sectional view of yet another dry erase board made in accordance with the present invention and illustrating a means for connecting the clear film layer to the substrate.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

FIG. 1 illustrates a dry erase board 10 made in accordance with the present invention. The board 10 includes a substrate or backing layer 11 and a clear film layer 12. The substrate layer 11 and clear film layer 12 are connected to one another at a common top edge 13 so that the clear film layer 12 may be peeled back as shown in FIG. 1. The clear film layer 12 has an outer surface 14 which serves as a writing surface for dry erase markers (not shown) which are known in the art. The substrate 11 also includes a front surface 15, part of which may be covered with a design, graphics or other indicia as shown by the dotted shading. The design, graphics or indicia can be seen through the clear film layer 12. As a result, a dry erase board 10 is provided with a design, graphics or indicia disposed underneath the clear film layer 12.

The design, graphics or indicia may either be disposed on a separate sheet 16 disposed between the front surface 15*a* of the substrate 11*a* and the clear film layer 12*a* as shown in FIG. 2 or the design, graphics or indicia may be disposed directly on the front surface 15*b* of the substrate 11*b* as shown in FIG. 3.

Turning to FIG. 2, the placement of the design, graphics or indicia on a middle sheet 16 is a preferred embodiment because of the ease in which the middle sheet 16 can be replaced with an alternative middle sheet (not shown). Specifically, in FIG. 2, the middle sheet 16 merely includes a plurality of horizontal lines, similar to that of lined paper. However, the middle sheet 16 may be replaced with another middle sheet (not shown) with any one of a large variety of designs printed thereon. Because the middle sheet 16 is a piece of paper, a design may be printed by way of a computer.

Further, the kit of the present invention may include software such as graphics software or word processing software to facilitate the creation and/or downloading of designs for printing on the middle sheet 16. The middle sheet 16 may be inserted directly into a computer printer for the printing of a design, graphics or indicia thereon. Accordingly, a kit made in accordance with the present invention may include a board 10 such as the one shown in FIG. 1 with a plurality of middle sheets 16 that are blank. The kit may also include a software program for loading onto the user's personal computer for purposes of printing a design, graphics or indicia on the middle sheet 16 which is provided as a part of the kit.

As an alternative, the design, graphics or indicia may be disposed directly on the surface 15*b* of the substrate 11*b* as shown in FIG. 3. Further, the surface 15*b* may be coated with a baked enamel finish, a porcelain finish or other suitable finish which would enable indicia to be written on the surface 15*b* but easily removed later on. Preferably, the indicia or writing would be able to be removed with water or another solvent that would not damage the clear film layer 12*b*.

In an alternative embodiment, the bottom side of the layer 12 can be printed on using, for example, a computer printer, and the top side would still be used as a dry erasable surface.

Turning to FIGS. 4–7, the clear film layer 12 may be attached to the substrate 11 in a variety of ways. In FIG. 4, an elongated clip 17 is provided with a spine 18 and opposing inwardly biased legs 19, 20 which hold the clear film layer 12, middle layer 16 and substrate 11 together. FIG. 5 illustrates the connection of the top edge 21 of the clear film layer 12 to the top edge 22 of the substrate 11 by way of a tape binding 23. Also, a layer of glue 24 may be used to adhere the tape binding 23 to the top edges 21, 22 of the clear layer 12 and substrate 11. Glue may also be disposed between the clear layer 12 and substrate 11 as shown in FIG. 5. FIG. 6 illustrates a lamination or a heat bonding between the clear film layer 12 and substrate 11. FIG. 6 also illustrates the placement of a middle sheet 16 between the clear film layer 12 and substrate 11. The fusing between the top edge 21 of the clear film layer 12 and the top edge 22 of the substrate 11 is shown at 25.

FIG. 7 illustrates a similar concept but with a layer of glue 26 disposed between the clear film layer 12 and substrate 11. No middle sheet 16 is shown in FIG. 7. However, a middle sheet 16 could be disposed between the clear film layer 12 and substrate 11 or indicia or graphics could be disposed directly on the front surface 15 of the substrate 11.

Accordingly, an improved dry erase port 10 is provided which enables the graphics, indicia or design disposed on the substrate 11 to be easily changed, modified or exchanged. A plurality of sheets 16 may be provided for placement between the clear film layer 12 and the substrate 11. Designs, graphics or indicia may be easily printed on the sheet 16 either by hand or by computer.

Suitable materials for the clear film layer 12 include polypropylene and polyethylene films. Other suitable materials are those films which are used for overhead projector films. These films are transparent and can be written on with dry erase markers and wiped off easily. Suitable materials for the substrate include cardboard or other materials that are sufficiently stiff to serve as a backing layer.

It should be noted that the concepts and devices disclosed herein can be used for wet erasable markers and such technology.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

What is claimed is:

1. An erase board comprising:

a substrate comprising a front surface and at least one edge, the substrate being disposed underneath a clear film layer comprising at least one edge, the edge of the clear film layer being attached to the edge of the substrate, the erase board further comprising indicia disposed between the substrate and the clear film layer.

2. The erase board of claim 1 wherein the indicia is disposed on a middle sheet that is sandwiched between the clear film layer and the substrate.

3. The erase board of claim 2 wherein the indicia is printed onto the middle sheet.

4. The erase board of claim 2 wherein the middle sheet is removable and replaceable with an alternative middle sheet with alternative indicia printed thereon.

5. The erase board of claim 3 wherein the indicia printed on the middle sheet is generated by a computer.

6. The erase board of claim 1 wherein the indicia is disposed on the front surface of the substrate.

7. The erase board of claim 1 wherein the indicia is painted onto the front surface of the substrate.

8. The erase board of claim 1 wherein the front surface of the substrate is coated with the indicia.

9. The erase board of claim 1 wherein the edge of the clear film layer is glued to the edge of the substrate.

10. The erase board of claim 1 wherein the edge of the clear film layer is laminated to the edge of the substrate.

11. The erase board of claim 1 wherein the edge of the clear film layer is heat bonded to the edge of the substrate.

12. The erase board of claim 1 wherein the edge of the clear film layer is attached to the edge of the substrate with an elongated clip.

13. The erase board of claim 1 wherein the erase board is a dry erase board.

14. A method of manufacturing a dry erase board, the method comprising the following steps:

providing a substrate comprising a front surface and at least one edge;

providing a middle sheet;

providing a clear film layer with at least one edge;

generating a design for printing on the middle sheet;

printing the design on the middle sheet;

placing the middle sheet on the substrate with the design facing upwards;

attaching the edge of the clear film layer to the edge of the substrate with the middle sheet disposed between the clear film layer and the substrate.

15. The method of claim 14 wherein the generating step is performed on a computer.

16. The method of claim 14 further comprising the steps of:

generating plurality of designs for printing on a plurality of alternative middle sheets;

printing the plurality of alternative designs on the plurality of alternative middle sheets.

17. The method of claim 14 wherein the middle sheet is removable from between the substrate and the clear film layer and replaceable with an alternative middle sheet having an alternative design printed thereon.

18. A kit for providing a custom dry erase board, the kit comprising:

a substrate comprising a front surface and at least one edge, the substrate being disposed underneath a clear film layer comprising at least one edge, the edge of the clear film layer being attached to the edge of the substrate, the kit further comprising a plurality of middle sheets for placement between the clear film layer and the substrate.

19. The kit of claim 18 further comprising a software program for creating a design on a computer and printing the design on the middle sheets with a computer printer.

20. The kit of claim 18 wherein the middle sheets have thereon printed designs.

* * * * *